US012633367B2

(12) United States Patent     (10) Patent No.:     US 12,633,367 B2
Kim et al.                          (45) Date of Patent:       May 19, 2026

(54) STORAGE DEVICE AND OPERATING METHOD OF CONTROLLER OF STORAGE DEVICE BASED ON PROGRAM OPERATION CONTROL

(71) Applicant: SK hynix Inc., Gyeonggi-do (KR)

(72) Inventors: Young Gyun Kim, Gyeonggi-do (KR); Hye Lyoung Lee, Gyeonggi-do (KR); Seung Gu Ji, Gyeonggi-do (KR); Dong Jae Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 202 days.

(21) Appl. No.: 18/510,664

(22) Filed: Nov. 16, 2023

(65) Prior Publication Data

US 2025/0022525 A1     Jan. 16, 2025

(30) Foreign Application Priority Data

Jul. 12, 2023     (KR) ........................ 10-2023-0090657

(51) Int. Cl.
*G11C 16/34*          (2006.01)
*G11C 16/10*          (2006.01)
*G11C 29/12*          (2006.01)

(52) U.S. Cl.
CPC ........ *G11C 29/1201* (2013.01); *G11C 16/102* (2013.01); *G11C 16/3459* (2013.01); *G11C 29/12005* (2013.01)

(58) Field of Classification Search
None
See application file for complete search history.

(56) References Cited

U.S. PATENT DOCUMENTS 7,876,623 B2     1/2011  Ha
2023/0031193 A1*  2/2023  Na ......................... G11C 16/08

FOREIGN PATENT DOCUMENTS

KR     10-2020-0122522  A     10/2020
KR     10-2021-0028517  A     3/2021

* cited by examiner

*Primary Examiner* — Alfredo Bermudez Lozada
(74) *Attorney, Agent, or Firm* — IP & T GROUP LLP

(57)                    ABSTRACT

A storage device includes a memory device and a controller. The memory device includes a plurality of memory regions. The controller is configured to perform a test operation on a target memory region among the memory regions when it is impossible to determine a second program standby time amount by which a second program operation remains as not performed on the target memory region after a first program operation is performed on the target memory region, and configured to control, according to a result of the test operation, the memory device to perform an adjusted second program operation on the target memory region.

20 Claims, 9 Drawing Sheets

BL1    BLm    MB

ST21    ST2m

ST11    ST1m

DST    DSL2

MCn    DSL1    WLn

MCn-1    WLn-1

MR12

MC2    SL

MR21    WL2

MC1    WL1    SSL2

MR11

SST    SSL1

Z
Y
X

| | ST1 | | ST2 | | ST3 | | ST4 | |
|---|---|---|---|---|---|---|---|---|
| | 1ST PROGRAM | 2ND PROGRAM | 1ST PROGRAM | 2ND PROGRAM | 1ST PROGRAM | 2ND PROGRAM | 1ST PROGRAM | 2ND PROGRAM |
| WL1 | 1 | 6 | 2 | 8 | 3 | 10 | 4 | 12 |
| WL2 | 5 | 14 | 7 | 16 | 9 | 18 | 11 | 20 |
| WL3 | 13 | 22 | 15 | 24 | 17 | 26 | 19 | 28 |
| ⋮ | ⋮ | ⋮ | ⋮ | ⋮ | ⋮ | ⋮ | ⋮ | ⋮ |

FIG. 13

STORAGE DEVICE AND OPERATING METHOD OF CONTROLLER OF STORAGE DEVICE BASED ON PROGRAM OPERATION CONTROL

CROSS-REFERENCES TO RELATED APPLICATION

The present application claims priority under 35 U.S.C. § 119(a) to Korean application number 10-2023-0090657, filed on Jul. 12, 2023, which is incorporated herein by reference in its entirety as set forth in full.

BACKGROUND

1. Technical Field

Various embodiments of the present disclosure relate to a storage device including a memory device.

2. Related Art

A storage device may be configured to store, according to a write request from an external device, data provided from the external device. Further, the storage device may be configured to provide, according to a read request from the external device, data stored therein to the external device. The external device may be an electronic device capable of processing data and may include computers, digital cameras, mobile phones and so forth. The storage device may be embedded within the external device to operate or may be designed in a detachable form to be connected to the external device to operate. The storage device may include a memory device for storing data.

A program operation of the memory device may affect previously stored data and damage the data. Therefore, a technology capable of reducing such effect is desired.

SUMMARY

In an embodiment of the present disclosure, a storage device may include a memory device and a controller. The memory device may include a plurality of memory regions. The controller may be configured to perform a test operation on a target memory region among the memory regions when it is impossible to determine a second program standby time amount, by which a second program operation remains as not performed on the target memory region after a first program operation is performed on the target memory region, and configured to control, according to a result of the test operation, the memory device to perform an adjusted second program operation on the target memory region.

In an embodiment of the present disclosure, an operating method of a controller of a storage device may include performing a test operation on a target memory region of a memory device when it is impossible to determine a second program standby time amount, by which a second program operation remains as not performed on the target memory region after a first program operation is performed on the target memory region; and determining, according to a result of the test operation, whether to control the memory device to perform an adjusted second program operation on the target memory region.

In an embodiment of the present disclosure, a storage device may include a memory device and a controller. The memory device may include a plurality of memory regions. The controller may be configured to perform a test operation on a target memory region among the memory regions, a first program operation having been performed on the target memory region and a second program operation not yet being performed on the memory region, and configured to perform, according to a result of the test operation, an adjusted second program operation on the target memory region in order to move, toward a lower threshold voltage, a highest program state among a plurality of program states of memory cells within the target memory region, the plurality of program states to be formed through the second program operation.

BRIEF DESCRIPTION OF THE DRAWINGS

FIG. 13 is a flowchart illustrating an operation of a storage device in accordance with an embodiment of the present disclosure.

DETAILED DESCRIPTION

Hereinafter, various embodiments of the present disclosure will be described below with reference to the accompanying drawings. The drawings are schematic illustrations of various embodiments and intermediate structures. As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of embodiments of the present disclosure. However, embodiments of the present disclosure should not be construed as limiting the inventive concept. Although a few embodiments of the present disclosure will be shown and described, it will be appreciated by those of ordinary skill in the art that changes may be made in these embodiments without departing from the principles and spirit of the present disclosure.

Figure 1:
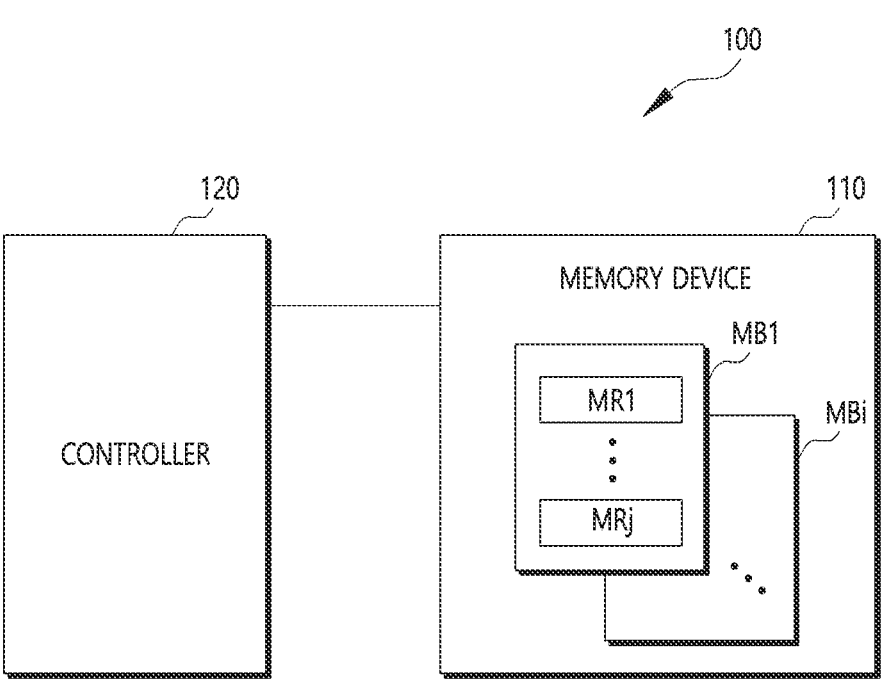
FIG. 1 is a block diagram illustrating a storage device in accordance with an embodiment of the present disclosure.

FIG. 1 is a block diagram illustrating a storage device 100 in accordance with an embodiment of the present disclosure.

The storage device 100 may be configured to store, according to a write request from a host device (not illustrated), data provided from the host device. Further, the storage device 100 may be configured to provide, according to a read request from the host device, data stored therein to the host device.

The storage device 100 may include a personal computer memory card international association (PCMCIA) card, a smart media card, a memory stick, various multimedia cards (e.g., MMC, eMMC, RS-MMC and MMC-micro), secure digital (SD) cards (e.g., SD, Mini-SD and Micro-SD), a universal flash storage (UFS) or a solid-state drive (SSD).

The storage device 100 may include a memory device 110 and a controller 120.

The memory device 110 may operate under the control of the controller 120. Operations of the memory device 110 may include a read operation, a write operation, an erase operation and so forth.

The memory device 110 may be implemented by various types of memory devices such as a NAND flash memory, a NOR flash memory, a resistive random-access memory (RRAM), a phase change RAM (PRAM), a Magneto-resistive RAM (MRAM), a ferroelectric RAM (FRAM), a spin transfer torque RAM (STT-RAM) and so forth.

The memory device 110 may include a plurality of memory blocks MB1 to MBi. Each of the memory blocks MB1 to MBi may include a plurality of memory regions MR1 to MRj. Each of the memory regions MR1 to MRj may include memory cells commonly connected to a single word line.

The controller 120 may control operations of the storage device 100. The controller 120 may control the memory device 110 according to requests from the host device. For example, in response to a write request from the host device, the controller 120 may store the data from the host device into the memory device 110. For example, in response to a read request from the host device, the controller 120 may read data from the memory device 110 and transmit the read data to the host device.

Furthermore, the controller 120 may independently control the memory device 110, meaning the controller 120 may perform internally necessary management operations even without receiving requests from the host device. For example, the management operations may include a wear levelling operation, a garbage collection operation, an erase operation and other related operations. In an embodiment, the controller 120 may perform the management operations according to requests from the host device.

In order to store data in each of the memory regions MR1 to MRj, the controller 120 may control the memory device 110 to perform, on each of the memory regions MR1 to MRj, a first program operation and then a second program operation. The controller 120 may control the memory device 110 to perform the first program operation and the second program operation according to a predetermined program sequence for the memory regions MR1 to MRj. According to the predetermined program sequence, the first program operation and/or the second program operation may be performed on another memory region between the first program operation and the second program operation on a particular memory region.

A target memory region may be, according to the predetermined program sequence, the earliest one (i.e., the first one) among the memory regions, on which only the first program operation has been completed. When it is impossible to determine a second program standby time amount, by which the second program operation remains as not performed on the target memory region among the memory regions MR1 to MRj after the first program operation is performed on the target memory region, the controller 120 may perform a test operation on the target memory region to determine a risk index and to control, based on this risk index, the memory device 110 to perform an adjusted second program operation on the target memory region. The risk index may indicate the possibility that data stored in a neighbouring memory region of the target memory region is damaged due to interference effects caused by the second program operation on the target memory region.

In an embodiment, the controller 120 may control the memory device 110 to lower a program verify voltage corresponding to the highest program state among the plurality of program states that the memory cells within the target memory region are supposed to form through the second program operation and to perform the adjusted second program operation by using the lowered program verify voltage. In this case, the lowered program verify voltage may be equal to or higher than a program verify voltage corresponding to the second highest program state among the plurality of program states.

In an embodiment, the controller 120 may modify target data, which is supposed to be stored into the target memory region through the second program operation, and may control the memory device 110 to perform the adjusted second program operation of storing the modified target data into the target memory region. Specifically, the controller 120 may modify the target data by modifying, to second data, the first data included in the target data. Here, the first data may correspond to the highest program state among the plurality of program states that the memory cells within the target memory region are supposed to form through the second program operation, and the second data may correspond to the second highest program state among the plurality of program states.

In an embodiment, the controller 120 may further control the memory device 100 to back-up, into another memory region among the memory regions, data that has been stored into the target memory region through the adjusted second program operation.

In an embodiment, the controller 120 may control the memory device 110 to perform the adjusted second program operation of storing dummy random data into the target memory region instead of target data, which is supposed to be stored into the target memory region through the second program operation.

In an embodiment, the controller 120 may control the memory device 110 to perform the second program operation on the target memory region when the second program standby time amount is less than a reference time amount.

In an embodiment, the controller 120 may control the memory device 110 to perform the second program operation on the target memory region when a risk index is less than a first reference value.

In an embodiment, the controller 120 may perform an abandonment process on the target memory region when the risk index is equal to or greater than a second reference value.

In an embodiment, the controller 120 may control the memory device 110 to perform the adjusted second program operation to reduce the interference effect on a neighbouring memory region of the target memory region. As a result, data stored in the neighbouring memory region of the target memory region may be protected from the interference effect that could become so excessive as to cause damage of the data.

Figures 2, 3:
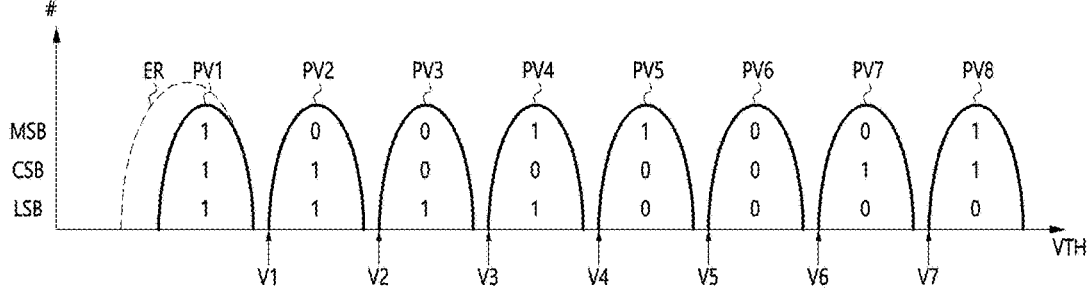
FIG. 2 is a circuit diagram illustrating a memory block in accordance with an embodiment of the present disclosure.
FIG. 3 is a diagram illustrating first to eighth program states of memory cells in accordance with an embodiment of the present disclosure.

FIG. 2 is a circuit diagram illustrating a memory block MB in accordance with an embodiment of the present disclosure. Each of the memory blocks MB1 to MBi of FIG. 1 may be configured in the similar manner to the memory block MB of FIG. 2.

Referring to FIG. 2, the memory block MB may include a plurality of strings ST11 to ST1m and ST21 to ST2m. Each of the strings ST11 to ST1m and ST21 to ST2m may extend in a vertical direction (e.g., Z-axis). Within the memory block MB, 'm' number of strings may be arranged in a row direction (e.g., X-axis). Although FIG. 2 illustrates two strings being arranged in a column direction (e.g., Y-axis), it is for the convenience of description and should be understood that three or more strings may be arranged in the column direction.

The strings ST11 to ST1m and ST21 to ST2m may be configured in the same manner. For example, the string ST11 may include a source select transistor SST, memory cells MC1 to MCn and a drain select transistor DST, which are connected in series between a source line SL and a bit line BL1. The source of the source select transistor SST may be connected to the source line SL and the drain of the drain select transistor DST may be connected to the bit line BL1. The memory cells MC1 to MCn may be connected in series between the source select transistor SST and the drain select transistor DST. In an embodiment, a plurality of source select transistors may be connected in series between the source line SL and the memory cell MC1. In an embodiment, the plurality of drain select transistors may be connected in series between the bit line BL1 and the memory cell MCn.

In the vertical direction, the source select transistors SST arranged at the same location may be configured as follows. Specifically, the gates of the source select transistors SST of the strings arranged in the same row may be connected to the same source select line. For example, the gates of the source select transistors SST of the strings ST11 to ST1m arranged in the first row may be connected to the source select line SSL1. For example, the gates of the source select transistors SST of the strings ST21 to ST2m arranged in the second row may be connected to the source select line SSL2.

In an embodiment, the source select transistors SST of strings arranged in multiple rows may be commonly connected to a single source select line. For example, the source select transistors SST of the strings ST11 to ST1m and ST21 to ST2m arranged in the first and second rows may be commonly connected to a single source select line. Similarly, the source select transistors SST of the strings arranged in the third and fourth rows may be commonly connected to a single source select line.

In the vertical direction, the drain select transistors DST arranged in the same location may be configured as follows. Specifically, the gates of the drain select transistors DST of the strings arranged in the same row may be connected to the same drain select line. For example, the gates of the drain select transistors DST of the strings ST11 to ST1m arranged in the first row may be connected to the drain select line DSL1. For example, the gates of the drain select transistors DST of the strings ST21 to ST2m arranged in the second row may be connected to the drain select line DSL2.

Strings arranged in the same column may be connected to the same bit line. For example, the strings ST11 and ST21 arranged in the first column may be connected to the bit line BL1. For example, the strings ST1m and ST2m arranged in the m-th column may be connected to the bit line BLm.

In the vertical direction, gates of memory cells arranged at the same location may be connected to the same word line. For example, the memory cell MC1 and other memory cells arranged at the same location in the vertical direction in the strings ST11 to ST1m and ST21 to ST2m may be connected to the word line WL1.

Among the memory cells, those connected to the same word line in the same row may form a single memory region. For example, the memory cells connected to the word line WL1 in the first row may form a single memory region MR11. For example, the memory cells connected to the word line WL1 in the second row may form a single memory region MR12. For example, the memory cells connected to the word line WL2 in the first row may form a single memory region MR21. Depending on the number of rows, each word line may be connected to a plurality of memory regions. The memory cells configuring a single memory region may be accessed simultaneously.

In an embodiment, the memory block MB may be further connected to one or more dummy word lines as well as the word lines WL1 to WLn. In this case, the memory block MB may further include dummy memory cells connected to the dummy word lines.

A memory cell may store one or more bits. A memory cell capable of storing therein one (1) bit is referred to as a single level cell (SLC), and a memory region and a memory block including the SLCs may be respectively referred to as a SLC memory region and a SLC memory block. A memory cell capable of storing therein multiple bits is referred to as an extra level cell (XLC), and a memory region and a memory block including the XLCs may be respectively referred to as an XLC memory region and an XLC memory block. The XLCs may include a multi-level cell (MLC), a triple-level cell (TLC), a quad-level cell (QLC), and so on. How many bits are to be stored in a memory cell (i.e., which one of the SLC, MLC, TLC, QLC, and another XLC the memory cell is to become to operate) may depend on the controller 120 during the operation of the storage device 120.

A single memory region including memory cells each capable of storing therein 'x' number of bits may logically include 'x' number of sub-regions, i.e., pages. For example, a TLC memory region including TLCs may logically include three pages: the least significant bit (LSB) page (also referred to as the lowest-level page) where the least significant bit is stored, the central significant bit (CSB) page (also referred to as the intermediate-level page) where the central significant bit is stored, and the most significant bit (MSB) page (also referred to as the highest-level page) where the most significant bit is stored. For example, a QLC memory region may logically include four pages: the LSB page where the least significant bit is stored, the first CSB page (also referred to as the first intermediate-level page) where the first central significant bit is stored, the second CSB page (also referred to as the second intermediate-level page) where the second central significant bit is stored, and the MSB page where the most significant bit is stored.

FIG. 3 is a diagram illustrating first to eighth program states PV1 to PV8 of memory cells in accordance with an embodiment of the present disclosure. In the following, the horizontal axis VTH may represent the threshold voltage of the memory cells and the vertical axis # may represent the number of memory cells having a corresponding threshold voltage. The present disclosure describing TLCs as an example may similarly apply to other types of memory cells other than the TLCs.

Referring to FIG. 3, TLC memory cells may be in first to eighth program states PV1 to PV8 depending on the data stored therein. The memory cells of the first to eighth program states PV1 to PV8 may be included in a single memory region. Each of the memory cells may be in one of the first to eighth program states PV1 to PV8 based on the 3-bit data stored therein. For example, a memory cell storing data 011 (i.e., the MSB of a bit value '0', the CSB of a bit value '1' and the LSB of a bit value '1') may be in the second program state PV2. According to an embodiment, when 'x' number of bits are stored in each memory cell, the memory cells may be in '2^x' number of program states.

Hereinafter, briefly described is the process of a program operation. A program voltage may be applied to memory cells in the erase state ER through the word line. Consequently, the threshold voltages of the memory cells may gradually rise because of the program voltage and the memory cells may become in the first to eighth program states PV1 to PV8. In order to verify whether the first to eighth program states PV1 to PV8 have been properly formed, the first to seventh program verify voltages V1 to V7 corresponding to the first to eighth program states PV1 to PV8 may be applied to the word line. For example, in order to verify whether a memory cell becomes in the second program state PV2, the first program verify voltage V1 may be applied to the word line. When the first program verify voltage V1 is be applied, the memory cells of the threshold voltages lower than the first program verify voltage V1 may be turned on to cause current to flow through the bit line connected to the memory cell. The memory cells of the threshold voltages higher than the first program verify voltage V1 may stay turned off to block current on the bit line connected to the memory cell even when the first program verify voltage V1 is be applied. The memory device 110 may determine the state of the memory cell by detecting the turn-on or the turn-off of the memory cell because of the first program verify voltage V1. Specifically, when a memory cell is supposed to become in the second program state PV2 but turned on because of the first program verify voltage V1, the memory device 110 may determine the current program state on the memory cell as a fail and may apply additional program voltage to the memory cell to further raise the threshold voltage of the memory cell. However, when a memory cell is supposed to become in the second program state PV2 and stays turned off despite the first program verify voltage V1, the memory device 110 may determine the current program state on the memory cell as a pass and may control not to further apply additional program voltage to the memory cell. The memory device 110 may determine the program operation for the second program state PV2 as completed when a number of memory cells of the threshold voltages lower than the first program verify voltage V1 is less than a threshold among the memory cells that are supposed to become in the second program state PV2. In a similar manner, the memory device 110 may determine whether the program operations for the individual third to eighth program states PV3 to PV8 have been completed by using the respective second to seventh program verify voltages V2 to V7.

Figure 4:
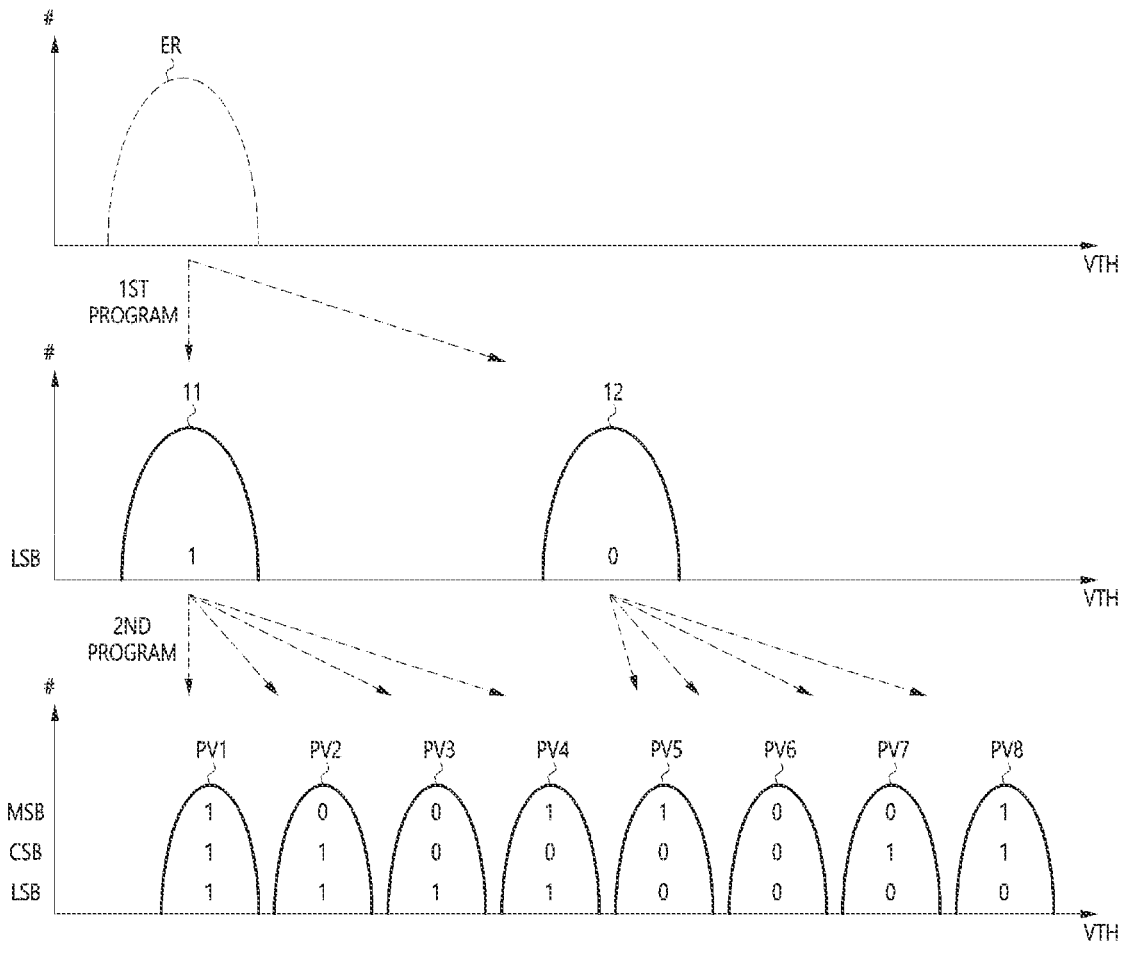
FIGS. 4 and 5 are diagrams illustrating schemes of first program operation and second program operation in accordance with an embodiment of the present disclosure.
Figures 5, 6:
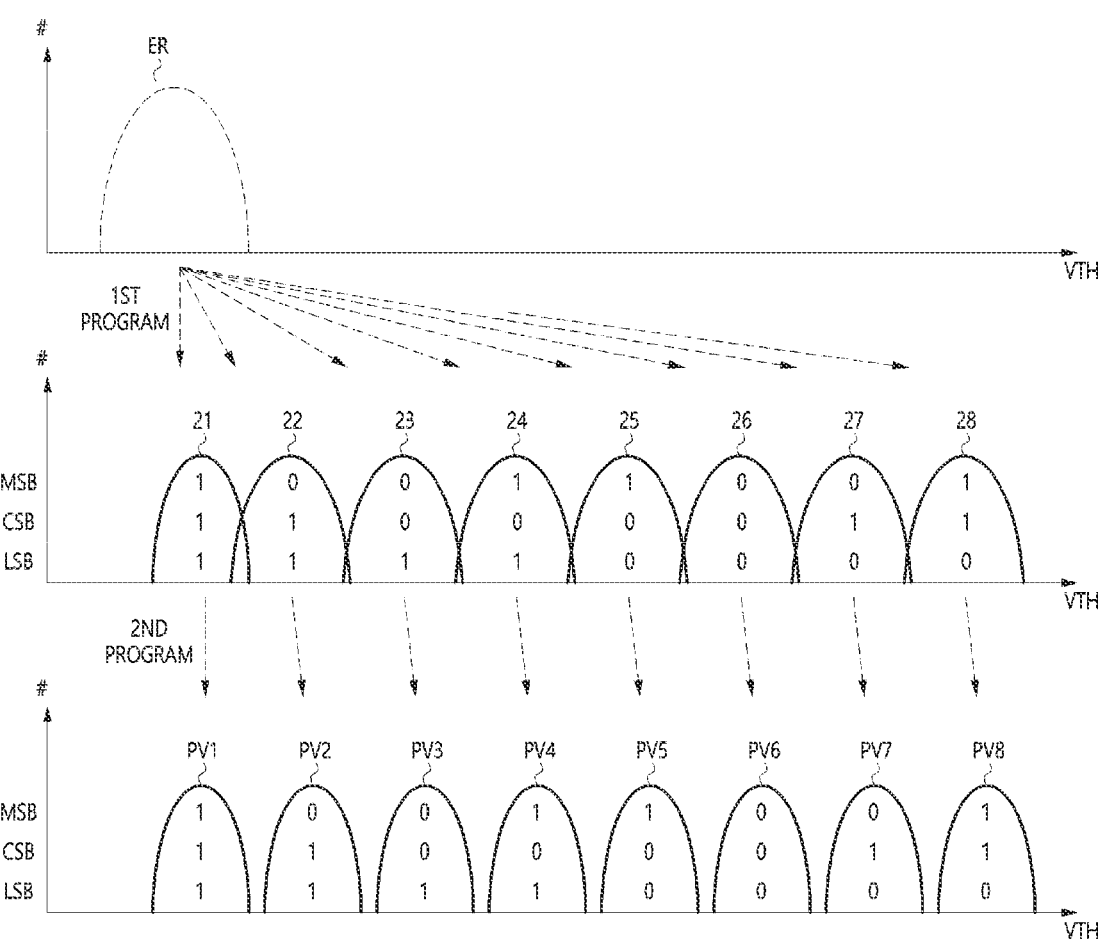
FIG. 6 is a table illustrating a program sequence in accordance with an embodiment of the present disclosure.

FIGS. 4 and 5 are diagrams illustrating schemes of first program operation and second program operation in accordance with an embodiment of the present disclosure.

Referring to FIG. 4, memory cells that have been in the erase state ER may form the first to eighth program states PV1 to PV8 through the first program operation and the second program operation.

Specifically, the first program operation may be an operation of storing data in one page (e.g., the LSB page) of a memory region. Through the first program operation on the memory region, data may be stored in the LSB page and the memory cells may become in the states 11 and 12.

The second program operation may be an operation of storing data in the remaining pages (e.g., the CSB page and MSB page) of the memory region. Through the second program operation on the memory region, the data may be stored in the CSB page and MSB page and the memory cells may become in the first to eighth program states PV1 to PV8. Specifically, the memory cells in the state 11 may form the first to fourth program states PV1 to PV4 through the second program operation and the memory cells in the state 12 may form the fifth to eighth program states PV5 to PV8 through the second program operation.

In an embodiment, when the first program operation is an operation of storing 'a' number of bits in each memory cell (i.e., when the first program operation is an operation of storing data in 'a' number of pages within the memory region), the memory cells may become in '2^a' number of states because of the first program operation. In this case, the second program operation may be an operation of storing data in the remaining pages other than the 'a' number of pages, on which the first program operation has been performed, among an entire 'x' ('x'>'a') number of pages within the memory region. The memory cells may become in '2^x' number of states because of the second program operation.

Referring to FIG. 5, which is different from the description with reference to FIG. 4, the first program operation may be an operation of coarsely storing data in all pages within the memory region. Through the first program operation on the memory region, the memory cells may become in states 21 to 28. To coarsely store the data means that the memory cells form the states 21 to 28, which are pre-states respectively for the first to eighth program states PV1 to PV8 and are not clearly distinctive therebetween, and that the data may not be completely stored therein. The data read from the memory region of the states 21 to 28 may have poor reliability.

The second program operation may be an operation of more finely storing the data, which have been coarsely stored in the memory region through the first program operation. Through the second program operation on the memory region, the memory cells may become in the first to eighth program states PV1 to PV8, which are more clearly distinctive therebetween than the states 21 to 28. Through the second program operation, the states 21 to 28 may become narrower respectively to become the first to eighth program states PV1 to PV8. The margins between the first to eighth program states PV1 to PV8 may be wider than the margins between the states 21 to 28.

FIG. 6 is a table illustrating a program sequence in accordance with an embodiment of the present disclosure. The table represents a program sequence only for the first to third word lines WL1 to WL3. In the table, the first to third word lines WL1 to WL3 and the first to fourth strings ST1 to ST4 are used to represent memory regions. Specifically, each of the first to third word lines WL1 to WL3 may be connected to four memory regions, for example. The four memory regions commonly connected to each of the first to third word lines WL1 to WL3 are distinguished by the first to fourth strings ST1 to ST4 that are commonly connected to a single bit line. Therefore, in the table of FIG. 6, each memory region may be distinguished by a corresponding word line of the first to third word lines WL1 to WL3 and a corresponding string of the first to fourth strings ST1 to ST4.

As represented in the table, the second program operation may be performed on a certain memory region (hereinafter, referred to as a selected memory region) after the first program operation on a neighbouring memory region of a subsequent word line has been completed. The neighbouring memory region of the subsequent word line refers to a memory region adjacent to the selected memory region in the Z direction as illustrated in FIG. 2. When the word line connected to the selected memory region is a k-th word line, a subsequent word line may be a (k+1)-th word line. The selected memory region and the neighbouring memory region of the subsequent word line may correspond to the same string.

Specifically, when the selected memory region is the memory region corresponding to the first string ST1 of the second word line WL2, the neighbouring memory region of the subsequent word line may be the memory region corresponding to the first string ST1 of the third word line WL3. The second program operation (i.e., the fourteenth program operation marked with dashed circles in the table of FIG. 6) may be performed on the selected memory region (i.e., the memory region corresponding to the first string ST1 of the second word line WL2) after the first program operation (i.e., the thirteenth program operation marked with solid circles in the table of FIG. 6) has been completed on the neighbouring memory region (i.e., the memory region corresponding to the first string ST1 of the third word line WL3).

The program sequence illustrated in the table of FIG. 6 may minimize the interference effects caused by the program operations. In contrast to the program sequence illustrated in the table of FIG. 6, when the second program operation is performed on the selected memory region and then the first program operation is performed on the neighbouring memory region of the subsequent word line, the first program operation on the neighbouring memory region of the subsequent word line may introduce the interference effects to the selected memory region and may damage the data stored in the selected memory region. However, according to the program sequence illustrated in the table of FIG. 6, the fourteenth program operation may mitigate the interference effects to the selected memory region, the interference effects being introduced by the thirteenth program operation. Therefore, the program sequence illustrated in the table of FIG. 6 may minimize interference effects caused by program operations and may enhance data reliability. However, according to the program sequence illustrated in the table of FIG. 6, the second program operation should be performed on the selected memory region inevitably after the first program operation is completed on the neighbouring memory region of the subsequent word line, which causes an excessive increase of a time amount (hereinafter, referred to as the second program standby time amount). The second program standby time amount may be a time amount, by which the second program operation remains as not performed on the selected memory region after the first program operation is performed on the selected memory region. When the second program standby time amount becomes excessively greater, an issue may occur as described below.

Figure 7:
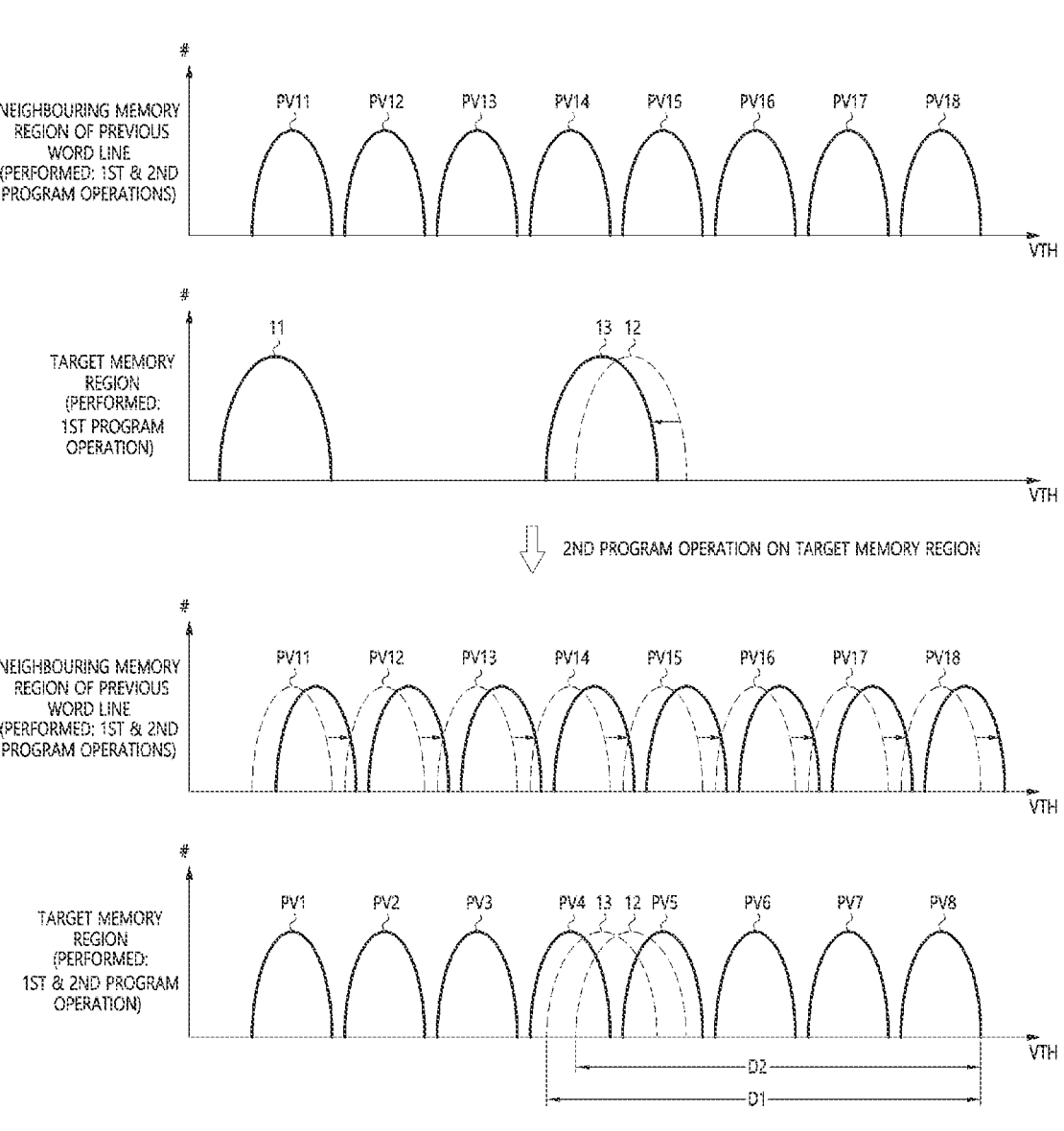
FIG. 7 is a diagram illustrating an interference effect introduced on a neighbouring memory region of a previous word line when a second program standby time amount becomes excessively greater.

FIG. 7 is a diagram illustrating an interference effect introduced on a neighbouring memory region of a previous word line when the second program standby time amount becomes excessively greater. In the following, a target memory region may be, according to the program sequence, the earliest memory region among the memory regions, on which only the first program operation has been completed. A target word line may be a word line connected to the target memory region. The neighbouring memory region of the previous word line may correspond to the same string as the target memory region and may be a memory region connected to the previous word line. When the target word line is a k-th word line, the previous word line may be a (k−1)-th word line.

Referring to FIG. 7, both the first and second program operations may have been performed on the neighbouring memory region of the previous word line. The memory cells in the neighbouring memory region of the previous word line may become in the first to eighth program states PV11 to PV18. The first program operation may have been performed on the target memory region but the second program operation may not be performed yet on the target memory region. The memory cells within the target memory region may become in the states 11 and 12. However, as the second program standby time amount becomes greater, the threshold voltages of memory cells in the state 12 may be lowered. Therefore, the state 12 may transition towards a lower threshold voltage to become a state 13.

Subsequently, the second program operation may be performed on the target memory region. As a result, the memory cells within the target memory region may become in the first to eighth program states PV1 to PV8. The second program operation on the target memory region may introduce the interference effects to the neighbouring memory region of the previous word line. The interference effects may raise the threshold voltages of the memory cells within the neighbouring memory region of the previous word line to shift the first to eighth program states PV11 to PV18 towards higher threshold voltages.

Meanwhile, when the second program operation is performed on the target memory region, a threshold voltage variance D1 required for the transition from the state 13 to the eighth program state PV8 may be greater than a threshold voltage variance D2 required for the transition from the state 12 to the eighth program state PV8. Furthermore, the greater the threshold voltage variance caused by the second program operation, the greater the interference effect on the neighbouring memory region of the previous word line may be. Therefore, the greater interference effects may be introduced to the neighbouring memory region of the previous word line when the second program operation is performed on the memory cells in the state 13 within the target memory region then when the second program operation is performed on the memory cells in the state 12 within the target memory region. In summary, as the second program standby time amount for the target memory region becomes greater, the threshold voltages of the memory cells within the target memory region may become further lowered. Consequently, through the second program operation on the target memory region, the neighbouring memory region of the previous word line may experience greater interference effects and the data stored in the neighbouring memory region may become further seriously damaged.

Figure 8:
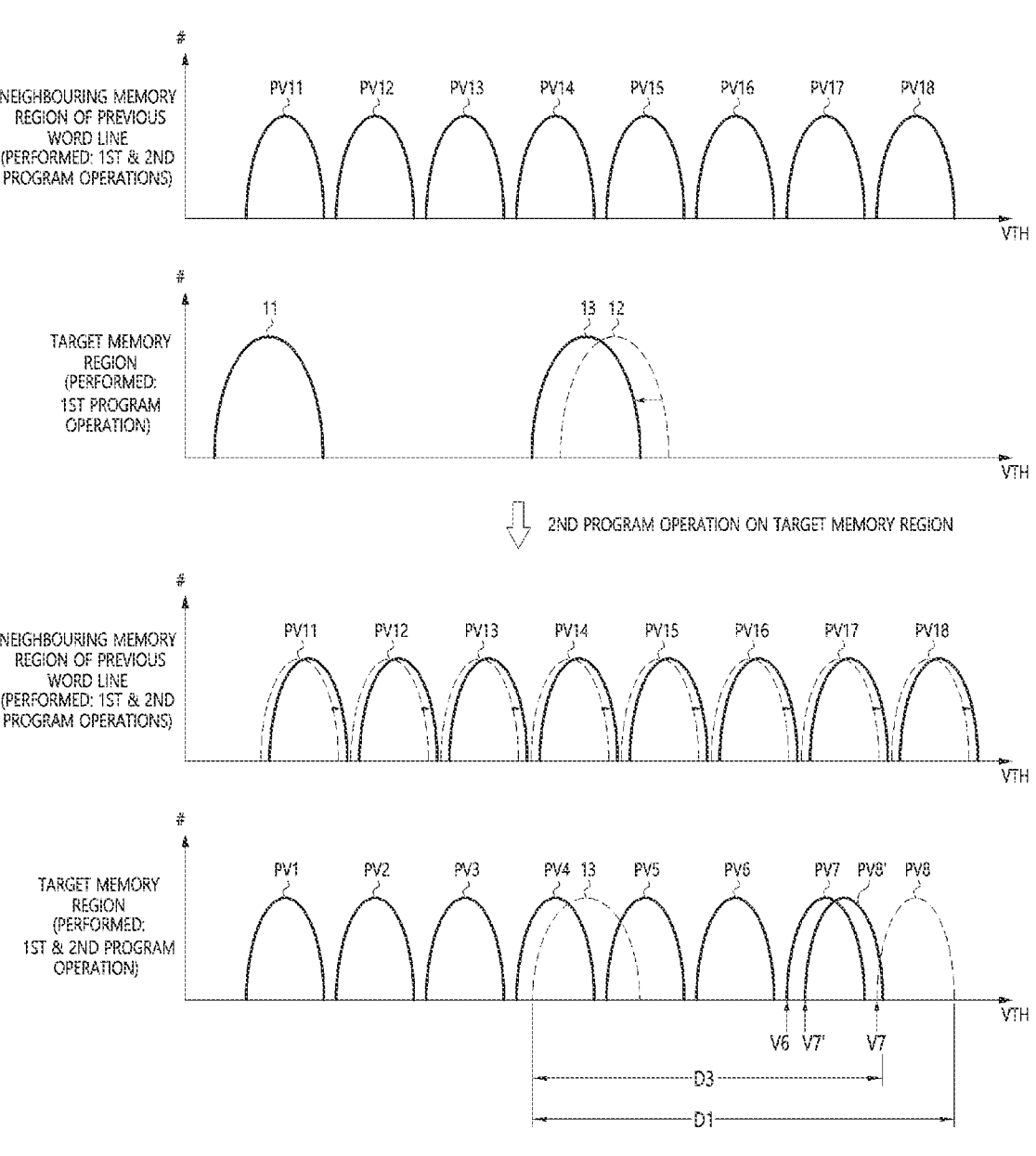
FIG. 8 is a diagram illustrating a scheme of an adjusted second program operation in accordance with an embodiment of the present disclosure.

FIG. 8 is a diagram illustrating a scheme of an adjusted second program operation in accordance with an embodiment of the present disclosure.

Referring to FIG. 8, when it is determined that the threshold voltages of the memory cells within the target memory region have been significantly lowered such as the transition of the threshold voltages of the memory cells from the state 12 to the state 13, the controller 120 may control the memory device 110 to perform an adjusted second program operation on the target memory region. The highest program state formed through the adjusted second program operation, namely, the eighth program state PV8', may become lower than the eighth program state PV8. However, the eighth program state PV8' may be the same as or higher than the seventh program state PV7. There may be at least a partial overlap between the eighth program state PV8' and the seventh program state PV7.

When the adjusted second program operation is performed on the target memory region, the threshold voltage variance D3 required for the transition from the state 13 to the program state PV8' through the adjusted second program operation may be smaller than the threshold voltage variance D1 required for the transition from the state 13 to the program state PV8. Therefore, the adjusted second program operation may introduce a smaller interference effect to the neighbouring memory region of the previous word line when compared with a regular (i.e., unadjusted) second program operation, and the transition amounts of the first to eighth program states PV11 to PV18 may be reduced.

The controller 120 may control the memory device 110 to lower the seventh program verify voltage V7 corresponding to the eighth program state PV8 when performing the adjusted second program operation. The lowered seventh program verify voltage V7' may be equal to or higher than the sixth program verify voltage V6. When performing the adjusted second program operation, the memory device 110 may verify, by using the lowered seventh program verify voltage V7', whether the eighth program state PV8' is formed. The adjusted second program operation described above may also be applied in the similar manner when the first and second program operations are performed according to the scheme described with reference to FIG. 5.

Figure 9:
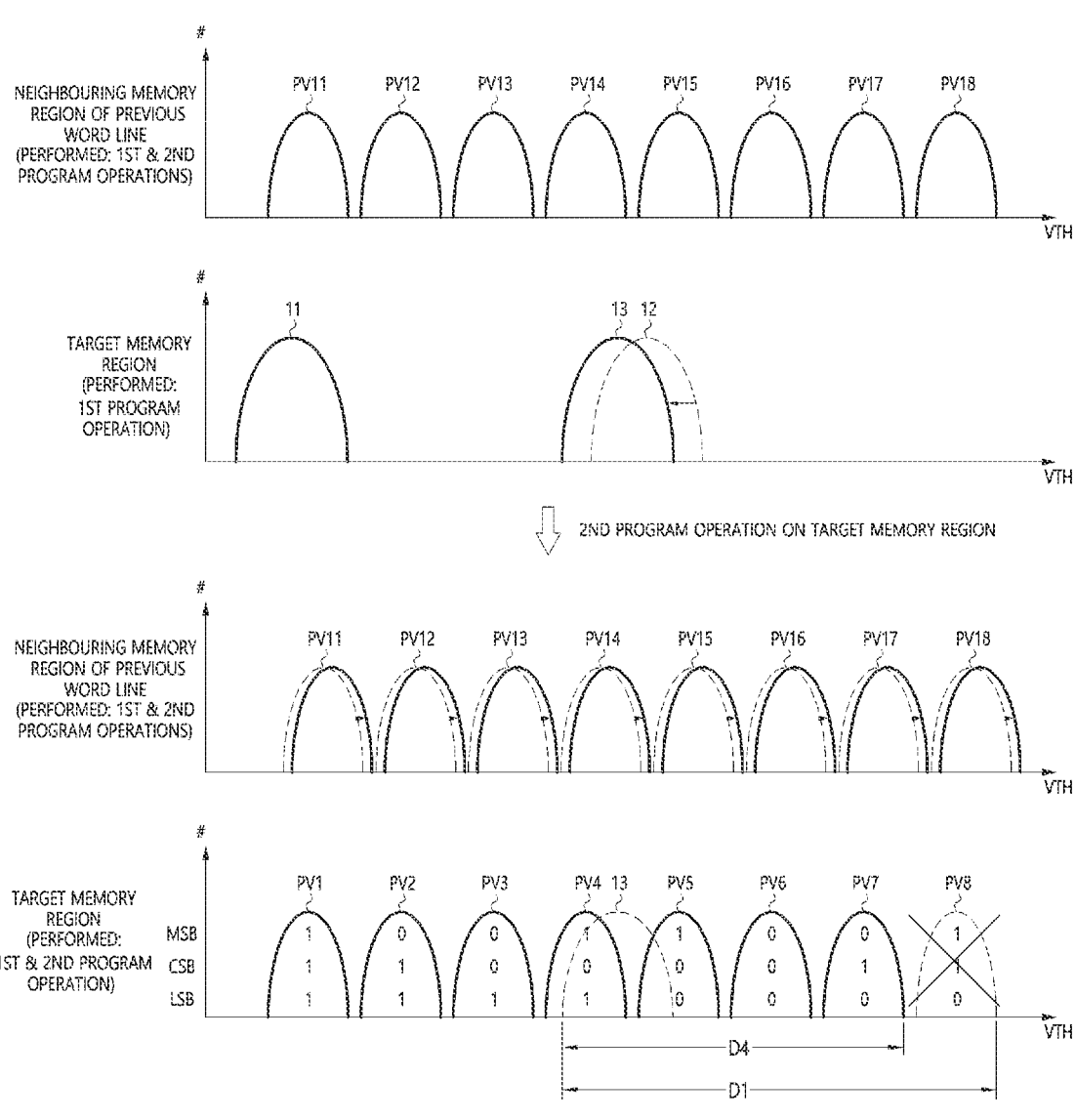
FIG. 9 is a diagram illustrating a scheme of an adjusted second program operation in accordance with an embodiment of the present disclosure.

FIG. 9 is a diagram illustrating a scheme of an adjusted second program operation in accordance with an embodiment of the present disclosure.

In an embodiment, the adjusted second program operation may be performed such that the memory cells within the target memory region become in the first to seventh program states PV1 to PV7. Namely, through the adjusted second program operation, the eighth program state PV8 may not be formed.

Specifically, among the target data that are supposed to be stored into the target memory region through the regular second program operation, the controller 120 may modify data corresponding to the eighth program state PV8 to become data corresponding to the second highest seventh program state PV7 among the first to eighth program states PV1 to PV8. Then, the controller 120 may control the memory device 110 to perform the adjusted second program operation of storing the modified target data in the target memory region. For example, when LSB data has been stored in the target memory region through the first program operation and MSB and CSB data are supposed to be stored in the target memory region through the adjusted second program operation, the controller 120 may modify data, of which a MSB having a value '1' and a CSB having a value '1' are supposed to be stored in a memory cell, to become data, of which the MSB having a value '1' and the CSB having a value '0'. Therefore, the memory cell that is supposed to become in the eighth program state PV8 through the second program operation may become in the seventh program state PV7 through the adjusted second program operation.

The threshold voltage variance D4 required for the transition from the state 13 to the program state PV7 through the adjusted second program operation may be smaller than the threshold voltage variance D1 required for the transition from the state 13 to the program state PV8. Therefore, the adjusted second program operation may introduce a smaller interference effect to the neighbouring memory region of the previous word line when compared to the regular (i.e., unadjusted) second program operation, and the transition amounts of the first to eighth program states PV11 to PV18 may be reduced.

The data stored in the target memory region through the adjusted second program operation may have lower reliability. Therefore, the controller 120 may back up the data, which has been stored in the target memory region through the adjusted second program operation, into another memory region. Additionally, the controller 120 may periodically check the data, which has been stored in the target memory region through the adjusted second program operation, and may move the data to another memory region when the data has too many errors.

In an embodiment, the adjusted second program operation described with reference to FIG. 9 may also be applied in the similar manner when the first program operation and the second program operation are performed as described with reference to FIG. 5. Specifically, the controller 120 may modify, to the data corresponding to the seventh program state PV7, the data corresponding to the eighth program state PV8 among the data, which has been coarsely stored in the target memory region through the first program operation. The controller 120 may then control the memory device 110 to perform the adjusted second program operation of finely storing the modified data into the target memory region.

In an embodiment, the adjusted second program operation described with reference to FIG. 8 or 9 may be performed by storing dummy random data or a specific value into the target memory region instead of the data that is supposed to be stored into the target memory region. In this case, the controller 120 may control the memory device 110 to store, into another memory region, the data, which is supposed to be stored into the target memory region.

Figure 10:
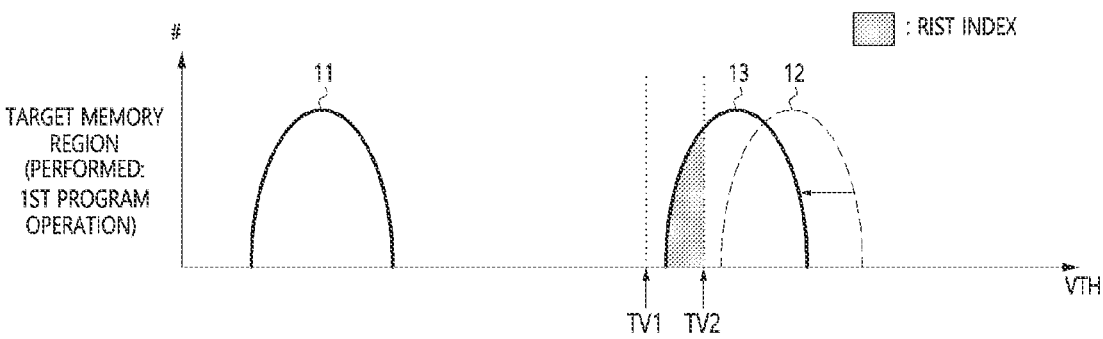
FIGS. 10 to 12 are diagrams illustrating a scheme of a test operation on a target memory region in accordance with an embodiment of the present disclosure.
Figure 11:
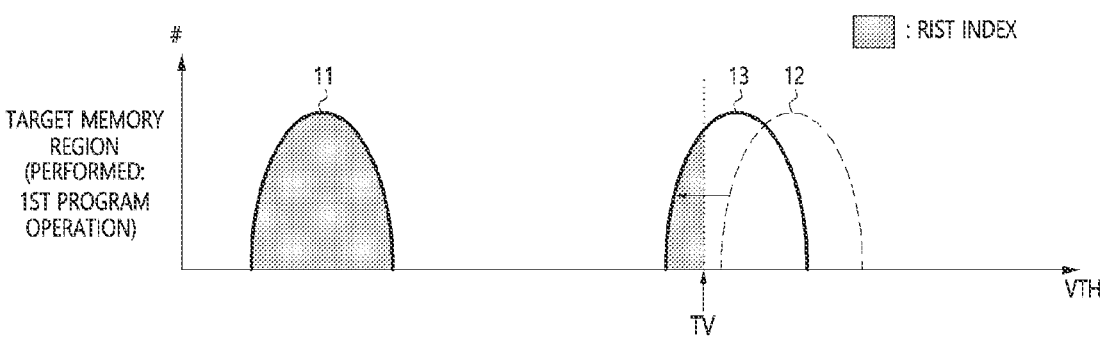
Figure 12:
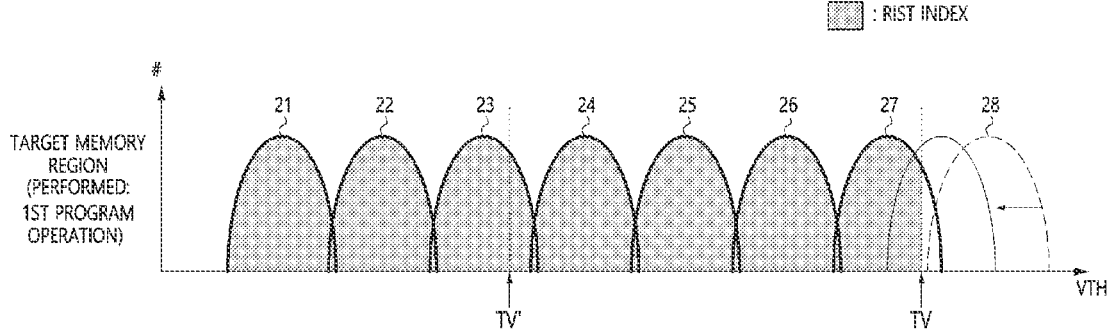

FIGS. 10 to 12 are diagrams illustrating a scheme of a test operation on a target memory region in accordance with an embodiment of the present disclosure.

As described above, the threshold voltages of the memory cells within the target memory region, on which the first program operation has been completed, may be significantly lowered as the second program standby time amount of the target memory region becomes greater. However, there might be a situation where it is impossible to identify the second program standby time amount for the target memory region. For instance, when the controller 120 has experienced a power-off event or has entered a sleep mode after the completion of the first program operation on the target memory region, the controller 120 may not clearly identify the second program standby time amount. Nevertheless, when the controller 120 includes a timer running even during the sleep mode, the controller 120 may still identify the second program standby time amount for the target memory region even when the controller 120 enters the sleep mode after the completion of the first program operation on the target memory region. Further, when the controller 120 has stored therein information of a time point when the first program operation is performed on the target memory region and the controller 120 can identify the current time point, the controller 120 may still identify the second program standby time amount for the target memory region.

Referring to FIG. 10, when the controller 120 is unable to identify the second program standby time amount for the target memory region, the controller 120 may perform a test operation on the target memory region to estimate how much the state 12 has shifted in the direction that the threshold voltage becomes lowered. The controller 120 may determine a risk index of the target memory region by performing the test operation based on a first test voltage TV1 and a second test voltage TV2. The risk index may represent a number of memory cells corresponding to the shaded region in FIG. 10. The risk index of the target memory region may represent the amount that the state 12 has shifted in the direction that the threshold voltage becomes lowered. The risk index of the target memory region may become greater as the state 12 has shifted a greater amount in the direction that the threshold voltage becomes lowered. The risk index may represent the likelihood that data stored in the neighbouring memory region of the previous word line have been damaged due to the interference effect caused by the second program operation on the target memory region.

Based on the risk index, the controller 120 may determine whether to perform a regular (i.e., unadjusted) second program operation, an adjusted second program operation or an abandonment process on the target memory region.

Specifically, the controller 120 may determine, as the risk index, the number of memory cells of the threshold voltages higher than the first test voltage TV1 and lower than the second test voltage TV2. More specifically, the controller 120 may control the memory device 110 to read first data from the memory cells within the target memory region by applying the first test voltage TV1 to the target word line. Based on the first data, the controller 120 may identify the memory cells of the threshold voltages lower than the first test voltage TV1 within the target memory region. For example, the controller 120 may determine memory cells, from which data 1 is read in response to the first test voltage TV1, as the memory cells of the threshold voltages lower than the first test voltage TV1. Also, the controller 120 may control the memory device 110 to read second data from the memory cells within the target memory region by applying the second test voltage TV2 to the target word line. Based on the second data, the controller 120 may identify the memory cells of the threshold voltages lower than the second test voltage TV2 within the target memory region. For instance, the controller 120 may determine memory cells, from which the data 1 is read in response to the second test voltage TV2, as the memory cells of the threshold voltages lower than the second test voltage TV2. Then, the controller 120 may determine the risk index by subtracting the number of memory cells of the threshold voltages lower than the first test voltage TV1 from the number of memory cells of the threshold voltages lower than the second test voltage TV2.

When the risk index is less than the first reference value REF1, the controller 120 may determine the state 12 not to have shifted significantly. When the risk index is less than the first reference value REF1, the controller 120 may determine to control memory device 110 to perform the regular second program operation on the target memory region.

When the risk index is equal to or greater than the first reference value REF1 and less than the second reference value REF2, the controller 120 may determine the state 12 to have shifted significantly. When the risk index is equal to or greater than the first reference value REF1 and less than the second reference value REF2, the controller 120 may determine to control memory device 110 to perform the adjusted second program operation on the target memory region.

When the risk index is equal to or greater than the second reference value REF2, the controller 120 may determine the state 12 to have shifted much significantly. When the risk index is equal to or greater than the second reference value REF2, there may be a high possibility that the interference effect is seriously severe on the neighbouring memory region of the previous word line and therefore the data stored in the neighbouring memory region of the previous word line may stay seriously damaged despite the adjusted second program operation. Accordingly, when the risk index is equal to or greater than the second reference value REF2, the controller 120 may determine to control memory device 110 to perform the predetermined abandonment process on the target memory region.

Specifically, when performing the abandonment process on the target memory region, the controller 120 may skip the second program operation or the adjusted second program operation on the target memory region and may not additionally store data (e.g., MSB and CSB data) into the target memory region. The abandonment process on the target memory region may include an operation of moving, into another memory region, the data that is supposed to be stored in the target memory region through the second program operation. The abandonment process on the target memory region may include an operation of moving, into another memory region, the data (e.g., LSB data) that has been stored in the target memory region through the first program operation. The abandonment process on the target memory region may include an operation of re-programming, into the target memory region, the data that has been stored in the target memory region through the first program operation, in order to make the data to have higher reliability. The abandonment process on the target memory region may include an operation of applying a dummy program voltage one or more times to the target word line, in order to improve the retention characteristic of the neighbouring memory region of the previous word line.

Referring to FIG. 11, in contrast to the test operation based on the first test voltage TV1 and the second test voltage TV2 as described with reference to FIG. 10, the controller 120 may determine the risk index of the target memory region by performing a test operation based on a single test voltage TV. The risk index may represent the number of memory cells corresponding to the shaded region in FIG. 11. The controller 120 may determine, as the risk index, the number of memory cells of threshold voltages lower than the test voltage TV. Specifically, the controller 120 may control the memory device 110 to read the first data from the memory cells within the target memory region by applying the test voltage TV to the target word line. Based on the first data, the controller 120 may identify the memory cells of the threshold voltages lower than the test voltage TV within the target memory region. For example, the controller 120 may determine memory cells, from which data 1 is read in response to the test voltage TV, as the memory cells of the threshold voltages lower than the test voltage TV.

The risk index of the target memory region may become greater as the state 12 has shifted a greater amount in the direction that the threshold voltage becomes lowered. In the similar manner as described with reference to FIG. 10, the controller 120 may compare the risk index with each of the first reference value REF1 and the second reference value REF2. Based on a result of the comparison of the risk index with each of the first reference value REF1 and the second reference value REF2, the controller 120 may determine whether to perform a regular (i.e., unadjusted) second program operation, an adjusted second program operation or an abandonment process on the target memory region.

Referring to FIG. 12, even when the first program operation has been performed and therefore the memory cells of the target memory region become in the states 21 to 28 as described with reference to FIG. 5, the controller 120 may perform a test operation in the similar manner as described with reference to FIG. 11. The controller 120 may use a single test voltage TV to determine a risk index representing the amount that the highest state 28 among the states 21 to 28 has shifted in the direction that the threshold voltage becomes lowered. The risk index may represent the number of memory cells corresponding to the shaded region in FIG. 12. The controller 120 may determine, as the risk index, the number of memory cells of threshold voltages lower than the test voltage TV. The risk index of the target memory region may become greater as the state 28 has shifted a greater amount in the direction that the threshold voltage becomes lowered. In the similar manner as described with reference to FIG. 10, the controller 120 may compare the risk index with each of the first reference value REF1 and the second reference value REF2. Based on a result of the comparison of the risk index with each of the first reference value REF1 and the second reference value REF2, the controller 120 may determine whether to perform a regular (i.e., unadjusted) second program operation, an adjusted second program operation or an abandonment process on the target memory region.

In an embodiment, the controller 120 may perform a test operation by determining the amount that another state (e.g., the state 24) other than the highest state 28 among the states 21 to 28 has shifted in the direction that the threshold voltage becomes lowered. For instance, the controller 120 may perform the test operation by using a single test voltage TV' to determine the amount that the state 24 has shifted in the direction that the threshold voltage becomes lowered.

In an embodiment, when the memory cells within the target memory region are in the states 21 to 28, the controller 120 may perform, in the similar manner as described with reference to FIG. 10, a test operation based on two test voltages instead of a single test voltage.

The first reference value REF1 and the second reference value REF2 may be heuristically determined differently in advance depending on the test operation. The first reference value REF1 and the second reference value REF2 utilized in the test operations described with reference to FIGS. 10 to 12 may be determined differently in advance.

Figure 13:
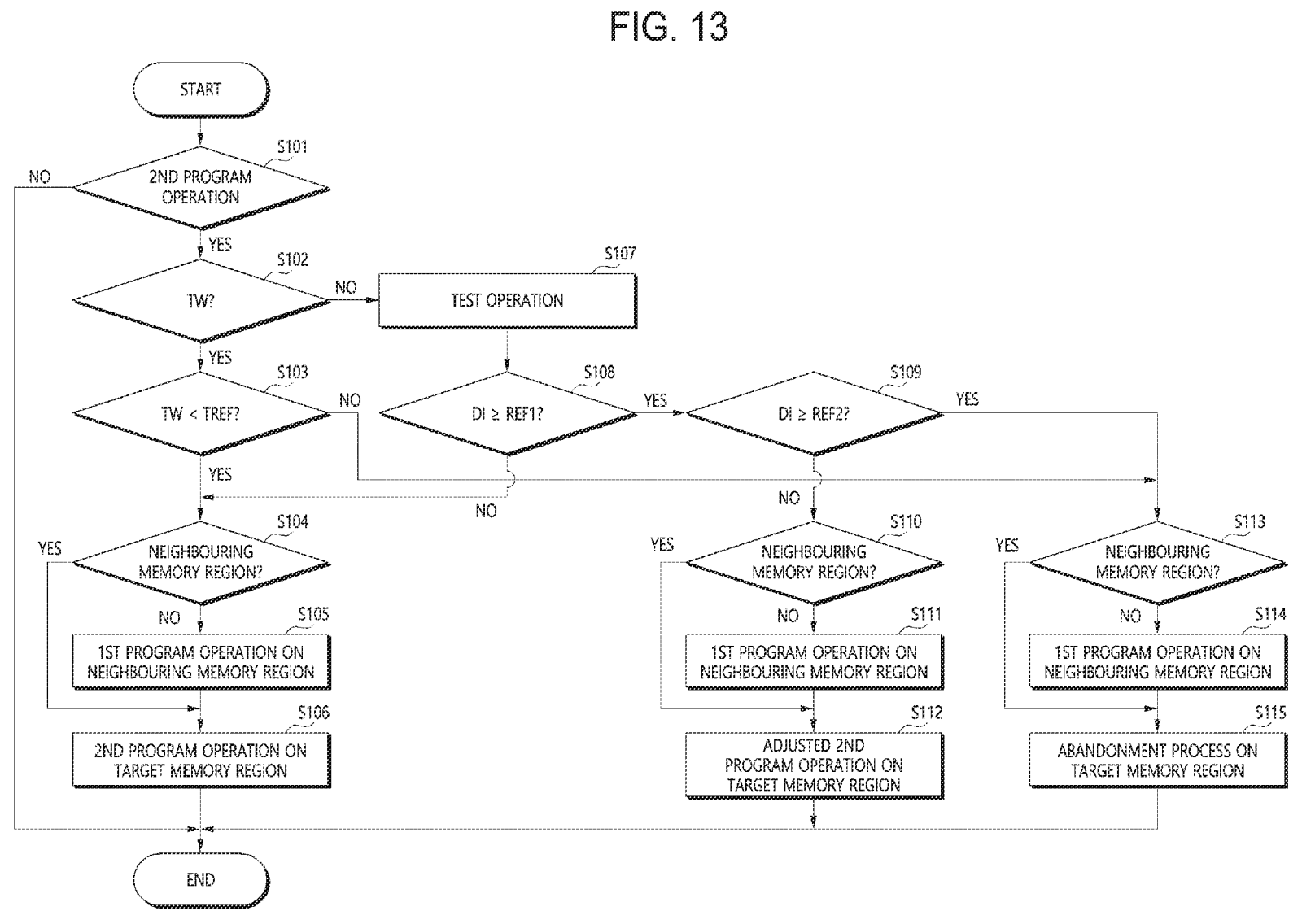

FIG. 13 is a flowchart illustrating an operation of the storage device 100 in accordance with an embodiment of the present disclosure.

In operation S101, the controller 120 may determine whether to control the memory device 110 to perform a second program operation on the target memory region connected to the target word line. The target memory region may be, according to the program sequence, the earliest one (i.e., the first one) among the memory regions, on which only the first program operation has been completed in a memory block. The target word line may be connected to the target memory region. For instance, the controller 120 may determine to control the memory device 110 to perform the second program operation on the target memory region when there is additional data to be stored in the target memory region through the second program operation according to the program scheme described with reference to FIG. 4. For example, the controller 120 may determine to control the memory device 110 to perform the first program operation on a neighbouring memory region of a subsequent word line and then perform the second program operation on the target memory region when there is data to be stored in the whole pages within the neighbouring memory region of the subsequent word line through the first program operation according to the program scheme described with reference to FIG. 5. When it is determined not to control the memory device 110 to perform the second program operation on the target memory region, the procedure may end (i.e., NO in the operation S101). When it is determined to control the memory device 110 to perform the second program operation on the target memory region (i.e., YES in the operation S101), the procedure may proceed to operation S102.

In operation S102, the controller 120 may determine whether it is possible to determine the second program standby time amount TW of the target memory region. The second program standby time amount TW refers to a time amount, by which a second program operation currently remains as not performed on the target memory region after a first program operation is performed on the target memory region. When it is possible to determine the second program standby time amount TW of the target memory region (i.e., YES in the operation S102), the procedure may proceed to operation S103. When it is not possible to determine the second program standby time amount TW (i.e., NO in the operation S102), the procedure may proceed to operation S107.

In operation S103, the controller 120 may determine whether the second program standby time amount TW of the target memory region is less than a predetermined reference time amount TREF. When the second program standby time amount TW of the target memory region is less than the reference time amount TREF (i.e., YES in the operation S103), the procedure may proceed to operation S104. When the second program standby time amount TW of the target memory region is not less than the reference time amount TREF, the procedure may proceed to operation S113 (i.e., NO in the operation S103).

In operation S104, the controller 120 may determine whether a first program operation has been performed on the neighbouring memory region of the subsequent word line. When it is determined that the first program operation has been performed on the neighbouring memory region of the subsequent word line (i.e., YES in the operation S104), the procedure may proceed to operation S106. When it is determined that the first program operation has not yet been performed on the neighbouring memory region of the subsequent word line (i.e., NO in the operation S104), the procedure may proceed to operation S105.

In operation S105, the controller 120 may control the memory device 110 to perform the first program operation on the neighbouring memory region of the subsequent word line.

In operation S106, the controller 120 may control the memory device 110 to perform the second program operation on the target memory region.

In operation S107, the controller 120 may perform a test operation on the target memory region. Through the test operation, the controller 120 may determine the risk index DI of the target memory region.

In operation S108, the controller 120 may determine whether the risk index DI of the target memory region is equal to or greater than the first reference value REF1. When the risk index DI is greater than or equal to the first reference value REF1, the procedure may proceed to operation S109 (i.e., YES in the operation S108). When the risk index DI is less than the first reference value REF1 (i.e., NO in the operation S108), the procedure may return to operation S104.

In operation S109, the controller 120 may determine whether the risk index DI of the target memory region is equal to or greater than the second reference value REF2. When the risk index DI is equal to or greater than the second reference value REF2 (i.e., YES in the operation S109), the procedure may proceed to operation S113. When the risk index DI is less than the second reference value REF2 (i.e., NO in the operation S109), the procedure may proceed to operation S110.

In operation S110, the controller 120 may determine whether the first program operation has been performed on the neighbouring memory region of the subsequent word line. When the first program operation has been performed on the neighbouring memory region of the subsequent word line (i.e., YES in the operation S110), the procedure may proceed to operation S112. When the first program operation has not yet been performed on the neighbouring memory region of the subsequent word line (i.e., NO in the operation S110), the procedure may proceed to operation S111.

In operation S111, the controller 120 may control the memory device 110 to perform the first program operation on the neighbouring memory region of the subsequent word line.

In operation S112, the controller 120 may control the memory device 110 to perform an adjusted second program operation on the target memory region. In an embodiment, the memory device 110 may perform the adjusted second program operation of storing dummy random data or a specific value into the target memory region instead of the data that is supposed to be additionally stored into the target memory region. In this case, the procedure may further include an operation (not specified) that the controller 120 controls the memory device 110 to store the data, which is supposed to be additionally stored in the target memory region, in another memory region.

In operation S113, the controller 120 may determine whether the first program operation has been performed on the neighbouring memory region of the subsequent word line. When the first program operation has been performed on the neighbouring memory region of the subsequent word line (i.e., YES in the operation S108), the procedure may proceed to operation S115. When the first program operation has not yet been performed on the neighbouring memory region of the subsequent word line (i.e., NO in the operation S108), the procedure may proceed to operation S114.

In operation S114, the controller 120 may control the memory device 110 to perform the first program operation on the neighbouring memory region of the subsequent word line. In an embodiment, in operation S114, the memory device 110 may perform the first program operation of storing dummy data into the neighbouring memory region of the subsequent word line. In this case, the procedure may further include an operation (not illustrated) in which the controller 120 controls the memory device 110 to store, into another memory region, the data that is supposed to be stored in the neighbouring memory region of the subsequent word line.

In operation S115, the controller 120 may perform the abandonment process on the target memory region.

While certain embodiments have been described above, it will be understood to those skilled in the art that the embodiments described are by way of example only. Accordingly, the storage device and the operating method of the controller of the storage device should not be limited based on the described embodiments. Rather, the storage device and the operating method of the controller of the storage device described herein should only be limited in light of the claims that follow when taken in conjunction with the above description and accompanying drawings. Furthermore, the embodiments may be combined to form additional embodiments.

What is claimed is:

1. An operating method of a controller of a storage device, the operating method comprising:
   performing a test operation on a target memory region among a plurality of memory regions included in a memory device prior to performing a second program operation on the target memory region, and
   controlling, according to a result of the test operation, the memory device to perform the second program operation on the target memory region, to perform an adjusted second program operation on the target memory region, or to perform another process instead of the second program operation on the target memory region.

2. The operating method of claim 1, wherein controlling the memory device to perform the adjusted second program operation on the target memory region includes controlling the memory device to:
   lower a program verify voltage corresponding to a highest program state among a plurality of program states of memory cells within the target memory region, the plurality of program states being formed through the second program operation; and
   perform the adjusted second program operation by using the lowered program verify voltage.

3. The operating method of claim 2, wherein the lowered program verify voltage is equal to or greater than a program verify voltage corresponding to a second highest program state among the program states.

4. The operating method of claim 1, wherein controlling the memory device to perform the adjusted second program operation on the target memory region includes:
   modifying target data, which is to be stored into the target memory region through the second program operation, and
   controlling the memory device to perform the adjusted second program operation of storing the modified target data into the target memory region.

5. The operating method of claim 4,
   wherein modifying the target data includes modifying first data included in the target data to second data,
   wherein the first data corresponds to a highest program state among a plurality of program states of memory cells within the target memory region, the plurality of program states being formed through the second program operation, and
   wherein the second data corresponds to a second highest program state among the program states.

6. The operating method of claim 1, further comprising controlling the memory device to back up, into another memory region among the plurality of memory regions, data that is stored into the target memory region through the adjusted second program operation.

7. The operating method of claim 1, wherein controlling the memory device to perform the adjusted second program operation on the target memory region includes controlling the memory device to perform the adjusted second program operation by storing dummy random data into the target memory region instead of target data, which is to be stored into the target memory region through the second program operation.

8. The operating method of claim 1, wherein controlling the memory device to perform the second program operation on the target memory region includes controlling the memory device to perform the second program operation on the target memory region when a second program standby time amount is less than a reference time amount.

9. The operating method of claim 1, wherein controlling the memory device to perform the second program operation on the target memory region includes controlling the memory device to perform the second program operation on the target memory region when a risk index is less than a first reference value, the risk index being determined through the test operation.

10. The operating method of claim 1, wherein controlling the memory device to perform another process instead of the second program operation on the target memory region includes controlling the memory device to perform another process instead of the second program operation on the target memory region when a risk index is equal to or greater than a second reference value, the risk index being determined through the test operation.

11. An operating method of a controller of a storage device, the operating method comprising:

performing a test operation on a target memory region of a memory device when it is unable to determine a second program standby time amount by which a second program operation remains as not performed on the target memory region after a first program operation is performed on the target memory region; and determining, according to a result of the test operation, whether to control the memory device to perform an adjusted second program operation on the target memory region.

12. The operating method of claim 11, wherein controlling the memory device to perform the adjusted second program operation on the target memory region includes controlling the memory device to:

lower a program verify voltage corresponding to a highest program state among a plurality of program states of memory cells within the target memory region, the plurality of program states being formed through the second program operation, and perform the adjusted second program operation by using the lowered program verify voltage.

13. The operating method of claim 12, wherein the lowered program verify voltage is equal to or greater than a program verify voltage corresponding to a second highest program state among the program states.

14. The operating method of claim 11, wherein the controlling the memory device to perform the adjusted second program operation on the target memory region includes:

modifying target data, which is to be stored into the target memory region through the second program operation; and controlling the memory device to perform the adjusted second program operation of storing the modified target data into the target memory region.

15. The operating method of claim 14, wherein the modifying the target data includes modifying first data included in the target data to second data, wherein the first data corresponds to a highest program state among a plurality of program states of memory cells within the target memory region, the plurality of program states being formed through the second program operation, and wherein the second data corresponds to a second highest program state among the program states.

16. The operating method of claim 11, wherein the controlling the memory device to perform the adjusted second program operation on the target memory region includes controlling the memory device to perform the adjusted second program operation by storing dummy random data into the target memory region instead of target data, which is to be stored into the target memory region through the second program operation.

17. The operating method of claim 11, further comprising controlling the memory device to perform the second program operation on the target memory region when the second program standby time amount is less than a reference time amount.

18. The operating method of claim 11, wherein the determining whether to control the memory device to perform the adjusted second program operation includes determining to control the memory device to perform the second program operation on the target memory region when a risk index is less than a first reference value, the risk index being determined through the test operation.

19. The operating method of claim 11, wherein the determining whether to control the memory device to perform the adjusted second program operation includes determining to perform an abandonment process on the target memory region when a risk index is equal to or greater than a second reference value, the risk index being determined through the test operation.

20. An operating method of a controller of a storage device, the operating method comprising:

performing a test operation on a target memory region among a plurality of memory regions, a first program operation having been performed on the target memory region and a second program operation not yet being performed on the memory region, and performing, according to a result of the test operation, an adjusted second program operation on the target memory region to move, toward a lower threshold voltage, a highest program state among a plurality of program states of memory cells within the target memory region, the plurality of program states being formed through the second program operation.

* * * * *